United States Patent
Tanaka

(10) Patent No.: US 7,446,473 B2
(45) Date of Patent: Nov. 4, 2008

(54) ORGANIC ELECTROLUMINESCENCE DISPLAY DEVICE

(75) Inventor: Masahiro Tanaka, Chiba (JP)

(73) Assignee: Hitachi Displays, Ltd., Mobara-shi (JP)

( * ) Notice: Subject to any disclaimer, the term of this patent is extended or adjusted under 35 U.S.C. 154(b) by 525 days.

(21) Appl. No.: 11/142,263

(22) Filed: Jun. 2, 2005

(65) Prior Publication Data

US 2005/0269948 A1 Dec. 8, 2005

(30) Foreign Application Priority Data

Jun. 2, 2004  (JP) ............................. 2004-164769

(51) Int. Cl.
*H05B 33/00* (2006.01)
(52) U.S. Cl. ..................... 313/506; 313/511; 313/512
(58) Field of Classification Search .......... 313/498–512
See application file for complete search history.

(56) References Cited

U.S. PATENT DOCUMENTS

2002/0008463 A1* 1/2002 Roach ........................ 313/492

FOREIGN PATENT DOCUMENTS

| JP | 2000-348859 | 12/2000 |
| JP | 2002-260847 | 9/2002 |

* cited by examiner

*Primary Examiner*—Nimeshkumar D. Patel
*Assistant Examiner*—Anthony T Perry
(74) *Attorney, Agent, or Firm*—Antonelli, Terry, Stout & Kraus, LLP.

(57) ABSTRACT

An organic electroluminescence display device is provided that prevents a desiccant from being deteriorated. This organic electroluminescence display device has a superior moisture resistance and forms a high barrier against moisture and oxygen while still keeping the display low profile and lightweight. The organic electroluminescence display includes a laminated material and, across this laminated material, a first flexible substrate and a second flexible substrate. The laminated material is composed of layers, with different conductivities, that constitute an electronic circuit that includes a pair of electrodes across a light-emitting layer. At least one of the first flexible substrate and the second flexible substrate includes a desiccant. The flexible substrate that includes this desiccant includes a metal foil that is a base material on which the desiccant is formed. The desiccant is composed of a plurality of island-like desiccant pieces each separated from other desiccant pieces.

19 Claims, 4 Drawing Sheets

ORGANIC ELECTROLUMINESCENCE DISPLAY DEVICE

BACKGROUND OF THE INVENTION

The present invention relates to an organic electroluminescence display device or an organic light-emitting display.

An organic light-emitting display (OLED) has a pixel area on the surface of a substrate. This pixel area is surrounded by gate signal lines extended in the x-axis direction and provided in parallel in the y-axis direction of the substrate, and drain signal lines extended in the y-axis direction and provided in parallel in the x-axis direction of the substrate. In this pixel area, the organic light-emitting display has at least thin-film transistors that are turned on by the scan signals from the gate signal lines and a light-emitting layer, that is, an organic EL layer, through which the current flows that corresponds to the video signal from the drain signal lines supplied from the thin-film transistors.

Because the characteristics of the light-emitting layer are deteriorated by oxidization or moisture, a substrate other than the one described above is provided to seal off the light-emitting layer from outside air, usually with a desiccant in the space where outside air is sealed off.

Although those substrates are usually made of glass, substrates made of resin are available today to increase the flexibility of the organic light-emitting display.

In this case, a multi-layer structure is known in which the desiccant is included in a flexible substrate that has the desiccant as one of its layers. See JP-A-2000-348859 and JP-A-2002-260847.

SUMMARY OF THE INVENTION

However, for an organic light-emitting display with the configuration described above, it is pointed out that the desiccant tends to deteriorate more rapidly than other members.

The investigation of this cause reveals that, even when moisture gets into only a part where a desiccant is provided, the moisture gets through the surrounding area first and then into the whole area and the desiccant contains too much moisture until finally it loses its function.

The investigation also reveals that the moisture gets into the desiccant from a part where the desiccant is exposed from the substrate or through an unwanted pinhole created in the substrate.

In view of the foregoing, it is an object of the present invention to provide an organic light-emitting display that prevents desiccants from deteriorating.

It is another object of the present invention to provide an organic electroluminescence display device or organic light-emitting display that has a superior moisture resistance and forms a high barrier against moisture and oxygen while still keeping the display low profile and lightweight.

The following briefly describes the overview of some of the inventions disclosed by this application.

An organic electroluminescence display device or organic light-emitting display according to a first characteristic of the present invention comprises a laminated material (PLS) which is composed of a lamination of a plurality of layers having different conductivities, on which a circuit including a plurality of light-emitting elements each having a light-emitting layer and a pair of electrodes opposing in a direction of the lamination across the light-emitting layer is formed, and whose main surface has a pixel array having the plurality of light-emitting elements arranged two-dimensionally (in a matrix manner or a honeycombed manner); and a first flexible substrate and a second flexible substrate (FB1, FB2) opposed each other across the pixel array and joined to both sides of the laminated material (PLS), one for each side wherein one (FB2) of the first flexible substrate and the second flexible substrate comprises at least one metal foil having main surfaces extending along the pixel array of the laminated material and a plurality of desiccant islands (DSC) arranged two-dimensionally on one of the main surfaces of the at least one metal foil (MFL) and the plurality of desiccant islands (DSC) are separated each other on the one main surface of the at least one metal foil (MFL).

When the flexible substrate (FB2) containing the at least one metal foil is joined to the laminated material (PLS), the at least one metal foil described above covers the pixel array formed on the laminated material (PLS). Therefore, one of the main surfaces of the at least one metal foil is opposed to the pixel array (in other words, one of main surfaces of the laminated material (PLS)) and the other main surface faces the opposite side of the pixel array. The desiccant islands described above are formed on one of the main surfaces of the metal foil as a film or a layer made of a material containing at least a desiccant. As one of the main surfaces of the metal foil, the latter metal foil main surface facing the opposite side of the pixel array should preferably be used.

An organic light-emitting display according to a second characteristic of the present invention comprises a laminated material (PLS) which is composed of a lamination of a plurality of layers having different conductivities, on which a circuit including a plurality of light-emitting elements each having a light-emitting layer and a pair of electrodes opposing in a direction of the lamination across the light-emitting layer is formed, and whose main surface has a pixel array having the plurality of light-emitting elements arranged two-dimensionally (in a matrix manner or a honeycombed madder); and a first flexible substrate and a second flexible substrate (FB1, FB2) opposed each other across the pixel array and joined to both sides of the laminated material (PLS), one for each side wherein one (FB2) of the first flexible substrate and the second flexible substrate comprises at least one metal foil (MFL) having main surfaces extending along the pixel array of the laminated material (PLS), a gas barrier layer (GB2) joined to one of the main surfaces of the at least one metal foil (MFL), and a plurality of desiccant islands (DSC) scattering on the one main surface of the at least one metal foil (MFL) and the plurality of desiccant islands (DSC) are held between the at least one metal foil (MFL) and the gas barrier layer (GB2) and are separated each other on the one main surface of the at least one metal foil (MFL).

When the flexible substrate (FB2) containing the at least one metal foil is joined to the laminated material (PLS), the at least one metal foil described above covers the pixel array formed on the laminated material (PLS). Therefore, one of the main surfaces of the at least one metal foil is opposed to the pixel array (in other words, one of main surfaces of the laminated material (PLS)) and the other main surface faces the opposite side of the pixel array. The desiccant islands described above are formed on one of the main surfaces of the metal foil as a film or a layer made of a material containing at least a desiccant. As one of the main surfaces of the metal foil, the latter metal foil main surface facing the opposite side of the pixel array should preferably be used.

An organic light-emitting display according to a third characteristic of the present invention is the organic light-emitting display according to the first characteristic and the second characteristic described above, wherein any of material layers joined to the plurality of desiccant islands (DSC) has a drying property lower than a drying property of the plurality of desiccant islands (DSC). It is desirable that the material layer neither show the drying property nor include a desiccant.

An organic light-emitting display according to a fourth characteristic of the present invention is the organic light-emitting display according to the third characteristic described above, wherein one of the material layers joined to the plurality of desiccant islands (DSC) is an adhesive layer (ADH3).

An organic light-emitting display according to a fifth characteristic of the present invention is the organic light-emitting display according to the first characteristic described above or the second characteristic described above, wherein a light from the plurality of light-emitting elements formed on the laminated material (PLS) is emitted through the second flexible substrate (FB1).

An organic light-emitting display according to a sixth characteristic of the present invention is the organic light-emitting display according to the first characteristic described above or the second characteristic described above, wherein the plurality of desiccant islands (DSC) are arranged in a matrix manner along the pixel array.

An organic light-emitting display according to a seventh characteristic of the present invention is the organic light-emitting display according to the first characteristic described above or the second characteristic described above, wherein the plurality of desiccant islands (DSC) are arranged in a honeycombed manner along the pixel array.

An organic light-emitting display according to an eighth characteristic of the present invention is the organic light-emitting display according to the first characteristic described above or the second characteristic described above, wherein the plurality of desiccant islands (DSC) are separated each other at least 100 μm.

An organic light-emitting display according to a ninth characteristic of the present invention is the organic light-emitting display according to the first characteristic described above or the second characteristic described above, wherein the at least one metal foil (MFL) is one foil selected from an aluminum foil, a copper foil, a gold foil, and a silver foil.

An organic light-emitting display according to a tenth characteristic of the present invention is the organic light-emitting display according to the first characteristic described above or the second characteristic described above, wherein the thickness of the at least one metal foil (MFL) is at least 12 μm.

An organic light-emitting display according to an eleventh characteristic of the present invention is the organic light-emitting display according to the first characteristic described above or the second characteristic described above, wherein the at least one metal foil (MFL) is a lamination structure of at least two foils selected from an aluminum foil, a copper foil, a gold foil, and a silver foil.

An organic light-emitting display according to a twelfth characteristic of the present invention is the organic light-emitting display according to the first characteristic described above wherein one (FB2) of the first flexible substrate and the second flexible substrate described above includes a base material (FS2) on which the at least one metal foil (MFL) is fixed, the at least one metal foil (MFL) is held between the base material (FS2) and the laminated material (PLS), and the plurality of desiccant islands (DSC) is held between the at least one metal foil (MFL) and the base material (FS2).

An organic light-emitting display according to a thirteenth characteristic of the present invention is the organic light-emitting display according to the second characteristic described above wherein the one (FB2) of the first flexible substrate and the second flexible substrate includes a base material (FS2) on which the gas barrier layer (GB2) is formed, the gas barrier layer (GB2) is held between the base material (FS2) and the at least one metal foil (MFL), and the at least one metal foil (MFL) is held between the base material (FS2) and the laminated material (PLS).

Other objects, features and advantages of the invention will become apparent from the following description of the embodiments of the invention taken in conjunction with the accompanying drawings.

DESCRIPTION OF THE EMBODIMENTS

Figure 4A:
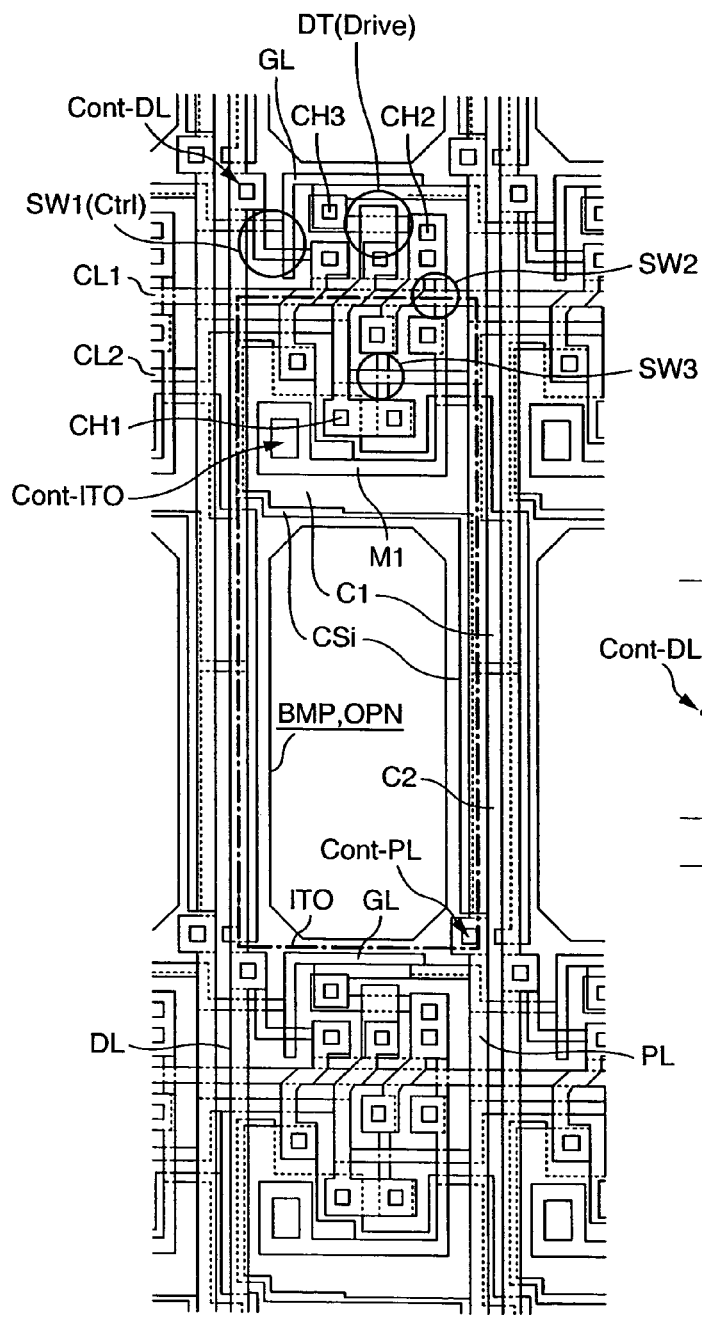
FIGS. 4A and 4B are an illustration and a circuit diagram showing one embodiment of the configuration of a pixel of the organic light-emitting display according to the present invention, respectively.
Figure 4B:
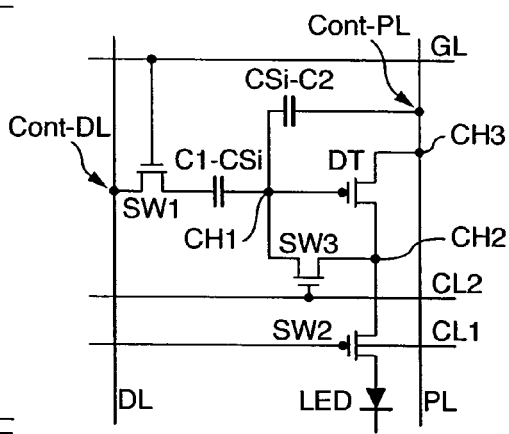

Embodiments of an organic light-emitting display according to the present invention will be described below with reference to the drawings. FIGS. 4A and 4B shows the configuration of one embodiment of a pixel of the organic light-emitting display according to the present invention.

FIG. 4A is a top view showing one pixel of the organic light-emitting display and its surrounding area. The pixels of the organic light-emitting display are formed in a matrix manner, for example, on the surface of a transparent substrate. FIG. 4A shows one of the pixels. An electrical conducting layer, a semiconductor layer, and an insulating layer, each formed in a predetermined pattern, are laminated to built a microcircuit into each pixel.

That is, the boundary of one pixel shown in the figure is indicated by the following four signal lines; a gate signal line GL in the top of the figure for selecting and driving the pixel, a drain signal line DL in the left side of the figure for supplying a video signal to the pixel, a current supply line PL in the right side of the figure for supplying a current to the pixel, and a gate signal line GL in the bottom for selecting and driving another pixel adjacent to the pixel.

The area of one pixel is divided into the top side and the bottom side in the figure. A light-emitting layer composed of an organic EL layer is formed in the bottom area, while a circuit for generating a current corresponding to the video signal is formed in the top area.

In the area in which the light-emitting layer is formed, one of electrodes (anode; indicated by ITO in the figure) composed of a translucent electrical conducting layer, the light-emitting layer, and another electrode (cathode) are laminated in this order on the substrate. The light-emitting layer is buried in the opening of a bank layer (BMP, OPN in the figure) formed on the top layer of the one of electrodes described above. This part virtually comprises a light-emitting unit. The other electrode, which covers the top face of the bank layer, is formed on and shared by the pixels.

With one electrode as the anode and the other as the cathode, the current flows through the light-emitting layer to cause the light-emitting layer to emit light according to the intensity of the current. The bank layer described above is provided to prevent light from the pixel from being transmitted to the adjacent pixels or to allow the light-emitting layer, originally fluid during the manufacturing process, to have a predetermined border.

The area in which the circuit is formed includes switching elements SW1, SW2, and SW3; a control signal line CL1 that turns on or off the switching element SW2; a control signal line CL2 that turns on or off the switching element SW3; a drive transistor DT; and capacitor elements C1-CSi and CSi-C2.

In response to the scan signal from the gate signal line GL, this circuit captures the video signal from the drain signal line DL and, according to the intensity (voltage) of this video signal, supplies the current from the current supply line PL to one electrode in the area in which the light-emitting layer is formed.

The switching elements SW2 and SW3 and the capacitor element CSi-C2 are provided to compensate for a variation in the threshold voltage of the drive transistor DT when the voltage varies from pixel to pixel.

FIG. 4B shows the equivalent circuit of the pixel described above, which is shown approximately corresponding to the geometrical layout in FIG. 4A.

The scan signal from the gate signal line GL turns on the switching element SW1 to allow the video signal from the drain signal line DL to be supplied to one electrode C1 of the capacitor element C1-CSi via the switching element SW1. At this time, the other electrode of the capacitor element C1-CSi is in the floating state.

The capacitor element C1-CSi keeps the gate voltage of the drive transistor DT, which has the gate electrode that is the same potential with the other electrode of the capacitor element C1-CSi, at a desired value for a predetermined period.

In this state, the control signal sent via the control signal line CL1 first turns on the switching element SW2. At this time, although the drive transistor DT is not turned on, its node CH2 side that is in the floating state is connected to the reference potential via an organic EL element LED and its potential is increased to a predetermined value.

Next, the control signal sent via the control signal line CL2 turns on the corresponding switching element SW3. This causes one electrode CSi of the capacitor element CSi-C2, which is in the floating state, to connect to the node CH2 side of the drive transistor DT via the switching element SW3 with its potential increased to the predetermined value. At this time, because the gate potential (potential of node CH1) of the drive transistor DT is at the same potential with the output side (node CH2), the channel layer of the drive transistor DT cuts off the flow of electrical charge.

The potential of the current supply line PL is approximately constant because a predetermined current flows through it regardless of the video signal sent via the drain signal line DL. Therefore, when the two switching elements SW2 and SW3 are sequentially turned on (the channel layers are sequentially made electrically conductive), approximately the same amount of electrical charge is stored in the capacitor element CSi-C2 of the pixels.

In this state, when the channel layer of the switching element SW3 is closed and then the switching element SW1 is turned on, the capacitance of the capacitor element C1-CSi changes according to the voltage (video signal) applied to one electrode C1 of the capacitor element C1-CSi and, in response to this change, a difference is generated between the potential of the node CH1 (gate potential of drive transistor DT) and the potential of the output side (node CH2 side).

This potential difference turns on the drive transistor DT and, at the same time, controls the amount of charge flowing through the turned-on channel to cause the organic EL element LED to emit a light at a desired brightness.

The pixels of the organic light-emitting display applicable to the present invention need not always have the configuration described above. For example, the pixels having a configuration in which there is no circuit for compensating for variations among the pixels in the threshold voltages of the drive transistor DT or in which there is no bank layer described above may also be applied.

Figure 5:
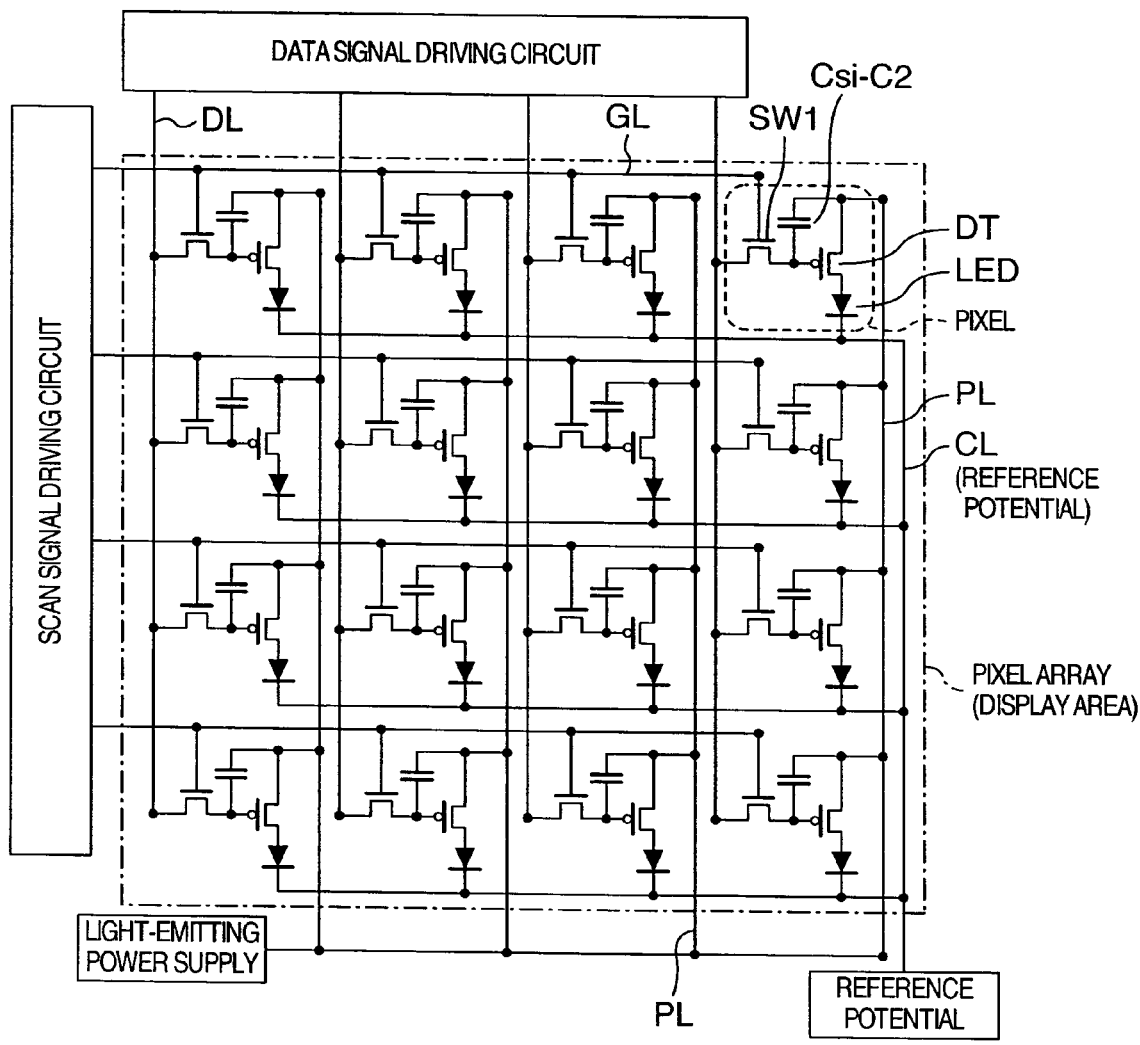
FIG. 5 is a diagram schematically showing an electronic circuit (equivalent circuit of a pixel array) formed on a laminated material of the organic light-emitting display according to the present invention.

A plurality of pixels, each having the configuration described above with reference to FIG. 4A and FIG. 4B, are arranged two-dimensionally (in a matrix manner) as shown in FIG. 5 to form a pixel array (form an image on the display screen of the organic light-emitting display). The circuit in each pixel shown in FIG. 4B is shown in a simplified form in FIG. 5 with the control signal lines CL1 and CL2 omitted. However, the gate signal line GL, the drain signal line DL, and the current supply line PL required for the image display operation of the organic light-emitting display are shown, and they are connected, respectively, to a scan signal driving circuit, a data signal driving circuit, and a light-emitting power supply provided outside the pixel array. FIG. 5 also shows a cathode current line CL (to which the reference potential is applied outside the pixel array) that receives the output current from the organic EL element LED that is not shown in FIG. 4B.

Recently, not only the electronic circuit of the pixel array, such as the one shown in FIG. 5, but also the electronic circuits of the scan signal driving circuit and the data signal driving circuit provided outside the pixel array electronic circuit are usually installed on the substrate (base material) of the organic light-emitting display.

Figure 1:
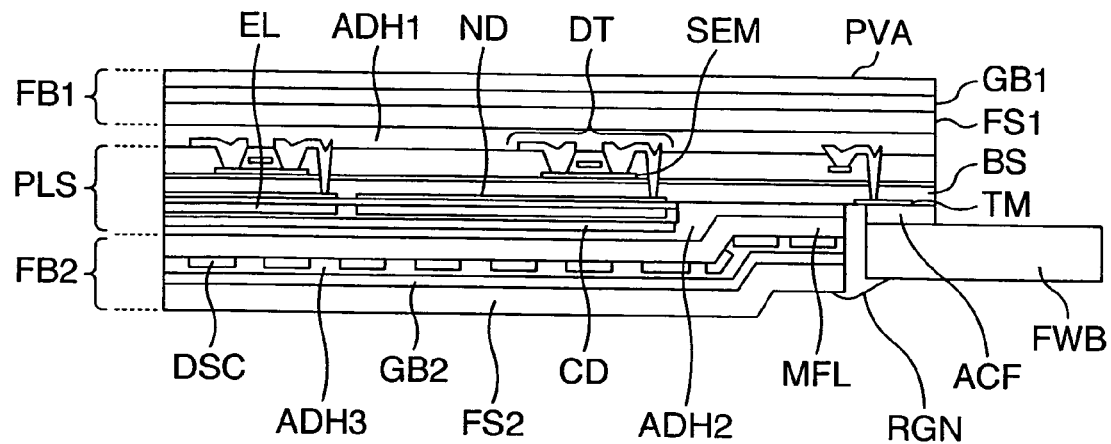
FIG. 1 is a cross sectional diagram of one embodiment of an organic light-emitting display according to the present invention.

FIG. 1 is a cross sectional diagram of an organic light-emitting display on which the pixels described above are formed. The figure also shows the cross section of the light-emitting layer.

The organic light-emitting display is composed roughly of a patterned electrical conductor layer, a semiconductor layer, and an insulating layer (each having different conductivity) laminated in a predetermined order. This structure is composed of a laminated material PLS on which the electronic circuits shown in FIG. 4B are formed, a first flexible substrate FB1 that is glued to one of the faces of the laminated material PLS with an adhesive layer ADH1, a second flexible substrate FB2 that is glued to the other face of the laminated material PLS with an adhesive layer ADH2, and a flexible wiring substrate FWB that is connected to a terminal TM formed on the laminated material PLS.

Laminated Material PLS

The laminated material PLS is formed by laminating various layers, with different conductivity, into the upper direction of the figure with an anode ND at its bottom wherein the anode is composed of superimposed light-emitting layers EL that will be described later. After that, the light-emitting layer EL is formed on the side on which the anode ND is formed and then a cathode CD is further formed on the light-emitting layer EL.

When the layers with different conductivity are laminated with the anode ND at the bottom layer, a substrate with a flat surface is required. This substrate is not shown in the figure because it is removed during the manufacturing process.

By laminating the layers with different conductivity as described above, the gate signal line GL, the drain signal line DL, the control signal lines CL1 and CL2, the current supply line PL, the switching elements SW1 to SW3, the drive transistor DT, the capacitor elements C1-CSi and CSi-C2, and the anode ND shown in FIG. 4B are formed. On the main surface of the temporary substrate that is removed during the manufacturing process of the laminated material PLS as described above, the anode ND and the terminal TM (terminals) are formed, then an insulating layer BS extending over the main surface of the temporary substrate is formed over the anode and the terminal TM, and then the switching elements SW1-SW3 and a semiconductor layer SEM of the drive transistor DT are formed on the insulating layer BS in this order. After the switching elements SW1-SW3 and the drive transistor DT are completed, the temporary substrate is removed from the anode ND, the terminal TM, and the insulating layer BS to which the temporary substrate is joined. In this stage, the anode ND and the terminal TM are buried halfway on one side of the main surface of the insulating layer BS (bottom surface in FIG. 1), and the electronic circuit of the pixel array shown in FIG. 5, except the organic EL element LED and the cathode current line CL, is almost completed on the other side of the main surface.

In this case, the circuit members in different layers are connected through the contact holes formed in the insulating film (for example, insulating layer BS described above). To a part to which a signal from an external component is supplied, the flexible wiring substrate FWB, which will be described later, is electrically be connected via the contact holes that run through the insulating layer BS to the terminal TM described above.

On the other hand, before sequentially forming the light-emitting layer EL and the cathode CD on the anode ND, the first flexible substrate FB1, which will be described later, should preferably be installed on the main surface (top surface in FIG. 1, where the switching elements SW1-SW3 and the drive transistor DT are formed) opposite to the main surface on which the anode ND of the laminated material PLS and the terminal TM have been formed before this stage. Instead of the first flexible substrate FB1, a relatively rigid substrate may also be used as a second temporary substrate. In either case, the laminated material PLS, which is weakened by removing the temporary substrate, is reinforced by the first flexible substrate FB1 or the second temporary substrate before the light-emitting layer EL is laminated on the anode ND and then the cathode CD is laminated on the light-emitting layer EL. This method makes it possible to form the organic EL element LED precisely in a desired position in the pixel array.

The light-emitting layer EL sometimes includes a hole transport layer on the anode ND side, and an electron transport layer and an electron injection layer on the cathode CD side, as necessary. The design concept of the organic light-emitting display in this specification includes those layers.

First Flexible Substrate FB1

The first flexible substrate FB1 has a gas barrier layer GB1 on one face of the film substance FS. This gas barrier layer GB1 is composed, for example, of an aluminum evaporation film or a silica/alumina co-evaporation film. This gas barrier layer GB1 prevents oxygen from entering from outside air.

This gas barrier layer GB1 has a protective film PVA on its top surface for protecting the gas barrier layer GB1 from an external interference.

With the adhesive ADH1 applied on the face of the film substance FS, the first flexible substrate FB1 configured as described above is glued, via the adhesive layer ADH1, to the face of the laminated material PLS opposite to the face on which the cathode CD is formed.

Second Flexible Substrate FB2

Unlike the first flexible substrate FB1 described above, the second flexible substrate FB2 comprises a substrate in which a desiccant layer DSC is included. This desiccant layer DSC absorbs moisture that gets into the substrate to prevent the moisture from reaching the light-emitting layer EL.

This desiccant layer DSC, formed all over the second flexible substrate FB2, is composed of a plurality of pieces. Each piece of the desiccant layer DSC is an island-like desiccant layer DSC piece physically separated from the adjacent other desiccant layer DSC pieces. As will be described later, the reason for using this configuration is that, even if one desiccant layer DSC piece becomes moist, this configuration prevents the moisture from reaching other adjacent desiccant layer DSC pieces.

Figure 2:
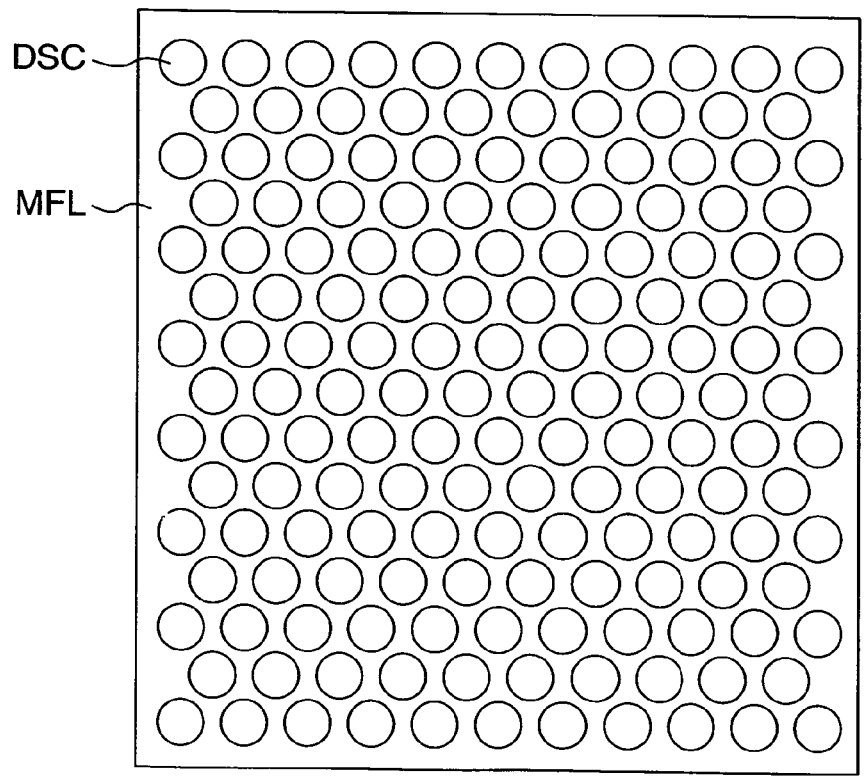
FIG. 2 is a top view showing one embodiment of a desiccant layer used in the organic light-emitting display according to the present invention.
Figure 3:
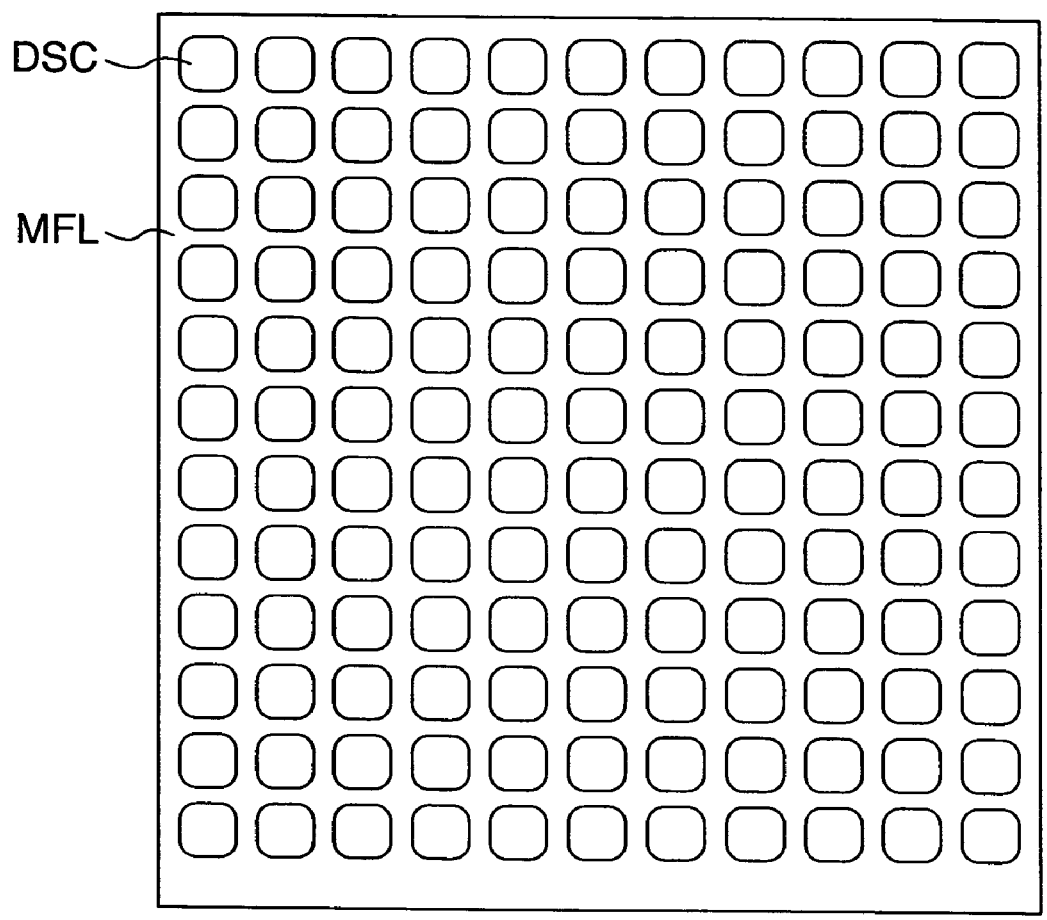
FIG. 3 is a top view showing another embodiment of a desiccant layer used in the organic light-emitting display according to the present invention.

FIG. 2 and FIG. 3 show a metal foil MFL that is a member of the second flexible substrate FB2. This metal foil MFL is made, for example, of aluminum (Al). This metal foil MFL is a film placed on the laminated material PLS side of the second flexible substrate FB2. When the second flexible substrate FB2 is joined to the laminated material PLS, the metal foil MFL is opposed to the pixel array shown in FIG. 5. In other words, the metal foil MFL extends all over the pixel array (one of main surfaces of the laminated material PLS) as shown, respectively, in FIG. 2 and FIG. 3, and covers the side of the pixel array on which the cathode CD of a plurality of organic EL elements is formed.

This metal foil MFL is about 12 μm or more in thickness is used. Although a metal foil of about 2 μm or more in thickness is enough for the barrier against moisture, a metal foil MFL of about 12 μ or more in thickness is required to ensure handling efficiency during the work. That is, as will be described later, the manufacturing method, which is automated by the roll-to-roll system for mass production, is usually employed during the process of applying a desiccant to the metal foil MFL or gluing the metal foil MFL to the resin. Of course, depending upon the handling during the work, it is also possible to use a metal foil MFL that is 12 μm or less in thickness.

It is obvious that a metal foil MFL with a thickness in this range, if used as a member of the second flexible substrate FB2, fully maintains the flexibility of the whole second flexible substrate FB2.

The material of this metal foil MFL is not limited to aluminum, but a copper foil, a gold foil, a silver foil, or a laminated foil of a selection of them may, of course, be used as the material of the metal foil MFL.

As compared with a resin foil, such a metal foil MFL is far more superior in moisture resistance and provides a high barrier against water or oxygen while keeping the device low profile and lightweight.

The desiccant layer DSC is formed on the top of the metal foil MFL. This desiccant layer DSC is an island-like pattern with the desiccant pieces arranged in a honeycombed manner as shown in the top view in FIG. 2. The desiccant layer DSC is arranged in such a way that the distance between one desiccant layer DSC piece and an adjacent desiccant layer DSC piece is, for example, 100 μm or more. In this case, the desiccant DSC is formed on the metal foil MFL (FB2) preferably by printing.

As the desiccant used for the desiccant layer DSC, alkali earth metal and its oxide, for example, Ca, CaO, and MgO, metal alcoholate with long chain carbon hydride, and zeolite may be used. Zeolite and metal alcoholate are most suitable when its liquid solution or dispersion liquid is used to form a desiccant through application/drying or baking.

The following describes one embodiment of a manufacturing method in which zeolite is used as the desiccant. First, zeolite powder and alkali solution containing a silicon oxide are kneaded together to form a paste for printing. After that, the paste is applied and printed on the metal foil MFL by the screen printing method and then the printed metal foil MFL is dried. Next, the metal foil MFL is baked in a baking furnace at about 400 degrees under a dry nitrogen atmosphere for dehydration to produce the desiccant layer DSC described above.

When Ca, Mg, or its oxide is used as the desiccant, the so-called mask evaporation method can be used to directly form a pattern on the metal foil MFL. This method gives the advantage of eliminating the high-temperature heating process.

The second flexible substrate FB2 further comprises another film substance (second film substance FS2) and has an gas barrier layer GB2 on one side of the second film substance FS2. This gas barrier layer GB is, for example, an aluminum evaporation film or a silica/alumina co-evaporation film. This gas barrier layer GB prevents oxygen from entering from the outside.

The face of the gas barrier layer GB side of this second film substance FS2 is glued to the face of the desiccant layer DSC side of the metal foil MFL with an adhesive layer ADH3 to configure the second flexible substrate FB2.

In this case, the material of the adhesive layer ADH3 is, for example, polypropylene or polyethylene. It is necessary that this material does not contain a desiccant. This is because, even if only a small amount of desiccant is contained in the adhesive layer ADH3, the moisture would be transmitted between physically separated pieces of the desiccant layer DSC via the desiccant contained in the adhesive layer ADH3.

The second flexible substrate FB2 with this configuration has the adhesive layer ADH2 applied to the face opposite to the face on which the desiccant layer DSC of the metal foil MFL is formed, and is glued to the face of the laminated material PLS (one of main surfaces of the laminated material PLS) on which the cathode CD is formed. Because the main surface of the metal foil MFL extends along the pixel array on the laminated material (PLS), the second flexible substrate FB2, if joined to the laminated material PLS in the way described above, allows the metal foil MFL (one of its main surfaces) to cover the pixel array formed on the laminated material PLS. At this time, the pixel array is opposed to the plurality of desiccant islands DSC via the metal foil MFL. On the other hand, the second flexible substrate FB2 is glued to the laminated material PLS so that the part, where the terminal TM (terminals) of the laminated material PLS (one of its main surfaces) is formed, is exposed. Therefore, the area of the main surface of the metal foil MFL and the area of the second film substance FS2 should preferably be smaller than the area of one of the main surfaces of the laminated material PLS.

The configuration of the second flexible substrate FB2 is not limited to the one described above. Instead, it is also possible to form a gas barrier layer on the film substance and form the desiccant layer DSC, which has the configuration described above, on the top of this gas barrier layer to allow the face on which the desiccant layer DSC is formed to be glued to the laminated material PLS via the adhesive layer.

Flexible Wiring Substrate FWB

The flexible wiring substrate FWB is a wiring substrate for supplying a signal to the organic light-emitting display. One end of the flexible wiring substrate FWB is electrically connected to the terminal TM (terminals) formed on the face of the laminated material PLS that is exposed from the second flexible substrate FB2.

The terminal TM is connected to the flexible wiring substrate FWB via an anisotropic conductive film ACF. A resin film RGN is filled in a gap between the flexible wiring substrate FWB and the second flexible substrate FB2 to prevent moisture from entering.

If the desiccant layer DSC included in the second flexible substrate FB2 of the organic light-emitting display with the configuration described above is formed as a continuous film pattern or a continuous flocculent pattern, a part of the desiccant layer DSC would be exposed, for example, at the end of the second flexible substrate FB2 and, from that part, the exposed desiccant layer DSC would absorb moisture, with the result that its reaction proceeds so rapidly that the desiccant layer DSC loses the moisture absorption ability.

In contrast, if the desiccant layer DSC is formed as an island-like non-continuous pattern as in this embodiment and even if one desiccant island of desiccant layer DSC is exposed and absorbs moisture, that desiccant island does not affect the moisture absorption ability of the neighboring islands of the desiccant layer DSC and therefore most of the desiccant layer DSC maintains the function. In addition, if a pinhole is formed in the gas barrier layer GB2 and even if moisture enters through this pinhole, only the desiccant islands of the desiccant layer DSC near the pinhole lose their function but most of other desiccant islands maintains the function.

Because the desiccant layer DSC can be made thick to some degree, the moisture absorption ability can be increased.

The flexible metal foil MFL used for the substance of the desiccant layer DSC gives the device the high moisture-absorption ability and the high barrier against moisture and oxygen and, in addition, makes the device low profile and lightweight.

Although the desiccant layer DSC formed on the surface of the metal foil MFL is arranged in a honeycombed manner in the embodiment described above as shown in FIG. 2, it is apparent that the desiccant layer DSC may also be arranged in a matrix manner as shown in FIG. 3.

Although the gas barrier layer GB2 is formed on the second film substance FS2 in the embodiment described above, the gas barrier layer GB2 need not always be provided. This is because the metal foil MFL can have a similar function.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An organic electroluminescent display device comprising:
   a laminated material which is composed of a lamination of a plurality of layers having different conductivities, on which a circuit including a plurality of light-emitting elements each having a light-emitting layer and a pair of electrodes opposing in a direction of the lamination across the light-emitting layer is formed, and whose main surface has a pixel array having the plurality of light-emitting elements arranged two-dimensionally; and a first flexible substrate and a second flexible substrate opposing to each other across said pixel array and joined to both sides of said laminated material, one for each side;

wherein one of said first flexible substrate and said second flexible substrate comprises at least one metal foil having main surfaces extending along said pixel array of said laminated material and a plurality of desiccant islands arranged two-dimensionally on one of the main surfaces of said at least one metal foil; and wherein said plurality of desiccant islands are separated from each other on said one main surface of said at least one metal foil.

2. The organic electroluminescence display device according to claim 1, wherein any of material layers joined to said plurality of desiccant islands has a drying property lower than a drying property of said plurality of desiccant islands.

3. The organic electroluminescence display device according to claim 2, wherein one of said material layers joined to said plurality of desiccant islands is an adhesive layer.

4. The organic electroluminescence display device according to claim 1, wherein a light from said plurality of light-emitting elements formed on said laminated material is emitted through another of said first flexible substrate and said second flexible substrate.

5. The organic electroluminescence display device according to claim 1, wherein said plurality of desiccant islands are arranged in a matrix manner along said pixel array or in a honeycombed manner along said pixel array.

6. The organic electroluminescence display device according to claim 1, wherein said plurality of desiccant islands are separated each other at least 100 μm.

7. The organic electroluminescence display device according to claim 1, wherein a thickness of said at least one metal foil is at least 12 μm.

8. The organic electroluminescence display device according to claim 1, wherein said one of said first flexible substrate and said second flexible substrate includes a base material on which said at least one metal foil is fixed, said at least one metal foil is held between said base material and said laminated material, and said plurality of desiccant islands are held between said at least one metal foil and said base material.

9. An organic electroluminescence display device comprising:

a laminated material which is composed of a lamination of a plurality of layers having different conductivities, on which a circuit including a plurality of light-emitting elements each having a light-emitting layer and a pair of electrodes opposing in a direction of the lamination across the light-emitting layer is formed, and whose main surface has a pixel array having the plurality of light-emitting elements arranged two-dimensionally; and a first flexible substrate and a second flexible substrate opposing to each other across said pixel array and joined to both sides of said laminated material, one for each sides wherein one of said first flexible substrate and said second flexible substrate comprises at least one metal foil having main surfaces extending along said pixel array of said laminated material, a gas barrier layer joined to one of said main surfaces of said at least one metal foil, and a plurality of desiccant islands scattered on said one main surface of said at least one metal foil; and wherein said plurality of desiccant islands are held between said at least one metal foil and said gas barrier layer and are separated from each other on said one main surface of said at least one metal foil.

10. The organic electroluminescence display device according to claim 9, wherein any of material layers joined to said plurality of desiccant islands has a drying property lower than a drying property of said plurality of desiccant islands.

11. The organic electroluminescence display device according to claim 10, wherein one of said material layers joined to said plurality of desiccant islands is an adhesive layer.

12. The organic electroluminescence display device according to claim 9, wherein a light from said plurality of light-emitting elements formed on said laminated material is emitted through another of said first flexible substrate and said second flexible substrate.

13. The organic electroluminescence display device according to claim 9, wherein said plurality of desiccant islands are arranged in a matrix manner along said pixel array or in a honeycombed manner along said pixel array.

14. The organic electroluminescence display device according to claim 9, wherein said plurality of desiccant islands are separated each other at least 100 μm.

15. The organic electroluminescence display device according to claim 9, wherein a thickness of said at least one metal foil is at least 12 μm.

16. The organic electroluminescence display device according to claim 9, wherein said one of said first flexible substrate and said second flexible substrate includes a base material on which said gas barrier layer is formed, said gas barrier layer is held between said base material and said at least one metal foil, and said at least one metal foil is held between said base material and said laminated material.

17. An organic electroluminescent display device comprising:

light emitting elements;

a gas buffer layer covering said light emitting elements;

a plurality of desiccant islands arranged two-dimensionally on a surface positioned between said light-emitting elements and said plurality of desiccant islands;

a metal foil arranged between said light emitting elements and said plurality of desiccant islands; and a first adhesive layer arranged between said gas barrier layer, said plurality of desiccant islands, and said metal foil;

wherein said plurality of desiccant islands are bound to each other and to the metal foil by the first adhesive layer, and said metal foil and said light-emitting elements are bounded by a second adhesive layer.

18. The organic electroluminescence display device according to claim 17 wherein said metal foil is selected from the group consisting of aluminum foil, copper foil, gold foil, and silver foil.

19. The organic electroluminescence display device according to claim 18 wherein said metal foil is a laminated structure comprising at least two foils selected from the group consisting of aluminum foil, copper foil, gold foil, and silver foil.

* * * * *